(12) United States Patent
Kiczenski et al.

(10) Patent No.: US 10,562,272 B2
(45) Date of Patent: Feb. 18, 2020

(54) LAMINATED GLASS ARTICLE WITH LOW COMPACTION AND METHOD FOR FORMING THE SAME

(71) Applicant: Corning Incorporated, Corning, NY (US)

(72) Inventors: Timothy James Kiczenski, Corning, NY (US); Samuel John Koseba, Corning, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 203 days.

(21) Appl. No.: 15/534,192

(22) PCT Filed: Dec. 7, 2015

(86) PCT No.: PCT/US2015/064223
§ 371 (c)(1),
(2) Date: Jun. 8, 2017

(87) PCT Pub. No.: WO2016/094282
PCT Pub. Date: Jun. 16, 2016

(65) Prior Publication Data
US 2017/0361574 A1 Dec. 21, 2017

Related U.S. Application Data

(60) Provisional application No. 62/089,006, filed on Dec. 8, 2014.

(51) Int. Cl.
*B32B 17/06* (2006.01)
*C03B 17/02* (2006.01)
(Continued)

(52) U.S. Cl.
CPC .............. *B32B 17/06* (2013.01); *C03B 17/02* (2013.01); *C03B 17/067* (2013.01); *C03B 25/08* (2013.01);
(Continued)

(58) Field of Classification Search
CPC .............................. C03B 17/02; C03B 17/064
See application file for complete search history.

(56) References Cited

U.S. PATENT DOCUMENTS

| 3,673,049 A | 6/1972 | Giffen et al. |
| 3,737,294 A | 6/1973 | Dumbaugh et al. |

(Continued)

FOREIGN PATENT DOCUMENTS

| WO | WO-2013099970 A1 * | 7/2013 | ............. C03C 3/091 |
| WO | 2013130700 A1 | 9/2013 | |

(Continued)

OTHER PUBLICATIONS https://patentscope.wipo.int/search/en/detail.jsf?docId=WO2013099970&tab=FULLTEXT&maxRec=1000 (Year: 2013).*

(Continued)

*Primary Examiner* — Jodi C Franklin
(74) *Attorney, Agent, or Firm* — Michael A. Hood; Svetlana Z. Short (57) ABSTRACT

A strengthened glass article (100), such as a substrate for a p-Si based transistors, includes first and second glass cladding layers (104, 106) and a glass core layer (102) disposed therebetween. A coefficient of thermal expansion [CTE] of each cladding layer (104, 106), which can be made of the same glass, is at least $1\times10^{-7}$° $C.^{-1}$ less than that of the core layer (102). Each of the core and cladding layers has a strain point less than 700° C. A compaction of the glass article (100) is at most about 20 ppm [see FIG. 1]. A method includes forming a glass article and/or heating a glass article (Continued)

to a first temperature of at least about 400° C. The glass article has a glass core layer (102) and a glass cladding layer (104, 106) adjacent to the core layer. The glass article is maintained at a temperature within a range of from 400° C. to 600° C. for a holding period from 30 to 90 minutes and subsequently cooled to a temperature of at most 50° C. over a cooling period from 30 seconds to 5 minutes. The glass article (100) for heat strengthening may have been produced by the fusion overflow down draw process, e.g. as depicted in FIG. 3.

23 Claims, 3 Drawing Sheets

(51) Int. Cl.

| | | |
|---|---|---|
| *C03B 17/06* | (2006.01) | |
| *C03B 25/08* | (2006.01) | |
| *C03B 25/12* | (2006.01) | |
| *C03B 32/00* | (2006.01) | |
| *H01L 21/02* | (2006.01) | |

(52) U.S. Cl.
CPC .............. *C03B 25/12* (2013.01); *C03B 32/00* (2013.01); *B32B 2250/03* (2013.01); *C03B 17/064* (2013.01); *H01L 21/02422* (2013.01); *H01L 21/02488* (2013.01); *H01L 21/02532* (2013.01)

(56) References Cited

U.S. PATENT DOCUMENTS

| | | | |
|---|---|---|---|
| 3,746,526 A | 7/1973 | Giffon | |
| 3,849,097 A | 11/1974 | Giffen et al. | |
| 3,931,438 A | 1/1976 | Beall et al. | |
| 4,018,965 A * | 4/1977 | Kerko | C03C 4/06 428/410 |
| 4,102,664 A | 7/1978 | Dumbaugh, Jr. | |
| 4,204,027 A * | 5/1980 | Simon | C03B 5/26 428/428 |
| 4,214,886 A | 7/1980 | Shay et al. | |
| 4,405,672 A | 9/1983 | Araujo et al. | |
| 5,342,426 A | 8/1994 | Dumbaugh, Jr. | |
| 5,559,060 A * | 9/1996 | Dumbaugh, Jr. | C03C 3/091 501/66 |
| 7,201,965 B2 * | 4/2007 | Gulati | B32B 17/06 428/1.1 |
| 7,514,149 B2 | 4/2009 | Bocko et al. | |
| 8,007,913 B2 | 8/2011 | Coppola et al. | |
| 8,136,371 B2 | 3/2012 | Kato et al. | |
| 8,598,056 B2 | 12/2013 | Ellison et al. | |
| 8,713,967 B2 | 5/2014 | Danielson et al. | |
| 9,340,443 B2 | 5/2016 | Bellman et al. | |
| 9,434,633 B2 * | 9/2016 | Bookbinder | C03B 17/02 |
| 2004/0197575 A1 * | 10/2004 | Bocko | B32B 17/06 428/432 |
| 2005/0001201 A1 | 1/2005 | Bocko et al. | |
| 2007/0190340 A1 * | 8/2007 | Coppola | B32B 17/06 428/432 |
| 2007/0191207 A1 * | 8/2007 | Danielson | C03C 3/091 501/66 |
| 2010/0126221 A1 * | 5/2010 | Danielson | C03B 17/067 65/95 |
| 2010/0129944 A1 | 5/2010 | Shimada et al. | |
| 2011/0318555 A1 * | 12/2011 | Bookbinder | C03B 17/02 428/213 |
| 2013/0065748 A1 * | 3/2013 | Koyama | C03C 3/091 501/67 |
| 2013/0225390 A1 | 8/2013 | Ellison et al. | |
| 2014/0141217 A1 * | 5/2014 | Gulati | C03C 3/091 428/212 |
| 2014/0179510 A1 * | 6/2014 | Allan | C03C 3/093 501/67 |
| 2014/0242375 A1 | 8/2014 | Mauro et al. | |
| 2014/0335331 A1 * | 11/2014 | Ellison | C03C 3/097 428/212 |
| 2015/0166391 A1 * | 6/2015 | Marjanovic | C03B 33/0222 428/43 |
| 2015/0274581 A1 * | 10/2015 | Beall | C03C 3/097 501/4 |
| 2017/0361574 A1 * | 12/2017 | Kiczenski | C03B 17/02 |

FOREIGN PATENT DOCUMENTS

| | | |
|---|---|---|
| WO | 2013130718 A1 | 9/2013 |
| WO | 2014055834 A1 | 4/2014 |
| WO | 2014163130 A1 | 10/2014 |
| WO | 2015148618 A1 | 10/2015 |
| WO | 2015171883 A1 | 11/2015 |

OTHER PUBLICATIONS

Allan et al; "Measurement and Analysis of Compaction in Fused Silica"; SPIE vol. 3578, 1998, pp. 16-27.
Corning, Inc. Lotus Glass; "Lotus Glass for High Performance Displays"; Product Information Sheet, 2011. 4 pgs.
International Search Report and Written Opinion of the International Searching Authority; PCT/US2015/064223; dated Mar. 14, 2016; 14 pages; European Patent Office.
Chinese Patent Application No. 201580075510.8; English Translation of the First Office Action dated Sep. 16, 2019; China Patent Office; 14 Pgs.
Indian Patent Application No. 201717019793; First Examination Report dated Oct. 24, 2019; India Patent Office; 7 Pgs.
Japanese Patent Application No. 2017530322; Machine Translation of the Office Action dated Nov. 20, 2019; Japan Patent Office; 4 Pgs.
European Patent Application No. 15810724.3; Examination Report dated Nov. 14, 2019; European Patent Office; 5 Pgs.

\* cited by examiner

LAMINATED GLASS ARTICLE WITH LOW COMPACTION AND METHOD FOR FORMING THE SAME

This application claims the benefit of priority to International Application No. PCT/US2015/064223, filed on Dec. 7, 2015, which claims the benefit of priority to U.S. Application No. 62/089,006, filed on Dec. 8, 2014, the content of each of which is incorporated herein by reference in its entirety.

BACKGROUND

1. Field

This disclosure relates to glass articles, and more particularly to laminated glass articles with low compaction and methods for forming the same.

2. Technical Background

When a molten glass is cooled rapidly from a high temperature, the movement of atoms within the cooling glass slows down with decreasing temperature and eventually diminishes to oscillations about fixed positions due to normal thermal population of vibrational states. These fixed positions typically are not the same positions that would be adopted were the glass to be held for an extended period of time (ranging from seconds to days) at intermediate temperatures (e.g., the glass transition temperature or the strain or annealing points). As a consequence, when a glass article that was rapidly quenched during forming is reheated to intermediate temperatures, the thermally-populated vibrational states allow for relaxation of atoms into positions that better satisfy their individual and collective bonding requirements. Such relaxation typically is accompanied by an irreversible decrease in the physical dimensions of a the glass article, and therefore, thermal relaxation upon reheating is said to produce compaction of the glass article.

Poly-crystalline silicon (p-Si) based transistors are characterized as having a higher electron mobility than amorphous-silicon (a-Si) based transistors. In the display field, thin film transistors (TFTs) based on poly-crystalline silicon can be preferred because of their ability to transport electrons more effectively. More effective electron transport enables the manufacture of smaller and faster transistors, which ultimately produces brighter and faster displays. One potential problem with p-Si based transistors is that their manufacture requires higher processing temperatures than those employed in the manufacture of a-Si transistors. Processing temperatures typically range from 450° C. to 600° C. for manufacturing p-Si based transistors compared to the 350° C. peak temperatures typically employed in manufacturing a-Si based transistors. At such higher temperatures, conventional glass substrates can experience substantial compaction, which can make it difficult or even impossible for a display manufacturer to properly align various components of the display.

SUMMARY

Disclosed herein are laminated glass articles comprising a determined compaction and method of forming the same.

Disclosed herein is a strengthened glass article comprising a first glass cladding layer, a second glass cladding layer, and a glass core layer disposed between the first glass cladding layer and the second glass cladding layer. A coefficient of thermal expansion (CTE) of each of the first glass cladding layer and the second glass cladding layer is at least $1 \times 10^{-7}$ °$C.^{-1}$ less than a CTE of the glass core layer. Each of the glass core layer and the glass cladding layer comprises a strain point of less than 700° C. A compaction of the glass article is at most about 20 ppm.

Disclosed herein is a method comprising forming a glass article comprising a glass core layer and a glass cladding layer adjacent to the glass core layer. The glass article is maintained within a hold temperature range from about 400° C. to about 600° C. for a holding period from about 30 minutes to about 90 minutes. The glass article is cooled to a quench temperature of at most about 50° C. over a cooling period from about 30 seconds to about 5 minutes subsequent to the maintaining step.

Disclosed herein is a method comprising heating a glass article to a first temperature of at least about 400° C. The glass article comprises a glass core layer and a glass cladding layer adjacent to the glass core layer. The glass article is maintained within a temperature range from about 400° C. to about 600° C. for a holding period from about 30 minutes to about 90 minutes. The glass article is cooled to a second temperature of at most about 50° C. over a cooling period from about 30 seconds to about 5 minutes subsequent to the maintaining step.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

Glass articles (e.g., glass sheets) produced using a fusion draw process can be beneficial for use in display devices because the fusion draw process provides improved surface quality compared to other forming processes such as float or slot draw processes. Such improved surface quality can include properties that can be beneficial for the display manufacturing process such as, for example, low surface roughness, low thickness variation, and desirable chemical composition (e.g., substantially alkali free surface). Such improved surface quality can aid display manufacturers in applying display electronics to the glass article during the display manufacturing process (e.g., using lithographic, printing, or other suitable processes). As the display industry continues to advance (e.g., toward curved or non-planar displays, flexible displays, transparent displays, and/or thinner displays), it may be beneficial to strengthen the glass articles incorporated into the displays. In some embodiments, the glass articles described herein have the strength and/or the substantially alkali free surface that can be beneficial to display manufacturers. Additionally, or alternatively, the glass articles can be formed using a fusion draw process to achieve a desirable surface quality.

In various embodiments, a glass article comprises at least a first layer and a second layer. For example, the first layer comprises a core layer, and the second layer comprises a cladding layer adjacent to the core layer. In some embodiments, the cladding layer comprises a plurality of cladding layers, and the core layer is disposed between two of the plurality of cladding layers. The first layer and/or the second layer are glass layers comprising a glass, a glass-ceramic, or a combination thereof. In some embodiments, the first layer and/or the second layer are transparent glass layers.

As used herein, the term "average coefficient of thermal expansion" refers to the average linear coefficient of thermal expansion of a given material or layer between 0° C. and 300° C. As used herein, the terms "coefficient of thermal expansion" and "CTE" refer to the average coefficient of thermal expansion unless otherwise indicated. The CTE can be determined, for example, using the procedure described in ASTM E228 "Standard Test Method for Linear Thermal Expansion of Solid Materials With a Push-Rod Dilatometer" or ISO 7991:1987 "Glass—Determination of coefficient of mean linear thermal expansion."

In some embodiments, the cladding layer has a different coefficient of thermal expansion than the core layer. Such a CTE mismatch between the cladding layer and the core layer can enable a strengthened glass article with significant damage tolerance. Additionally, or alternatively, the cladding layer is substantially alkali free. In such embodiments, there can be some interdiffusion of alkali ions into the cladding layer from the core layer (e.g., to form a diffusion layer at the interface of the cladding layer and the core layer). However, such interdiffusion generally is limited to a distance of from about 10 μm to about 20 μm from the interface of the cladding layer and the core layer. In some embodiments, the cladding layer comprises a thickness of at least about 30 μm. Thus, the cladding layer can provide a substantially alkali free barrier layer between the diffusion layer and the core layer. A substantially alkali free cladding layer can be beneficial to prevent alkali poisoning of electronic devices (e.g., Si based transistors) formed on the surface of the glass article.

Figure 1:
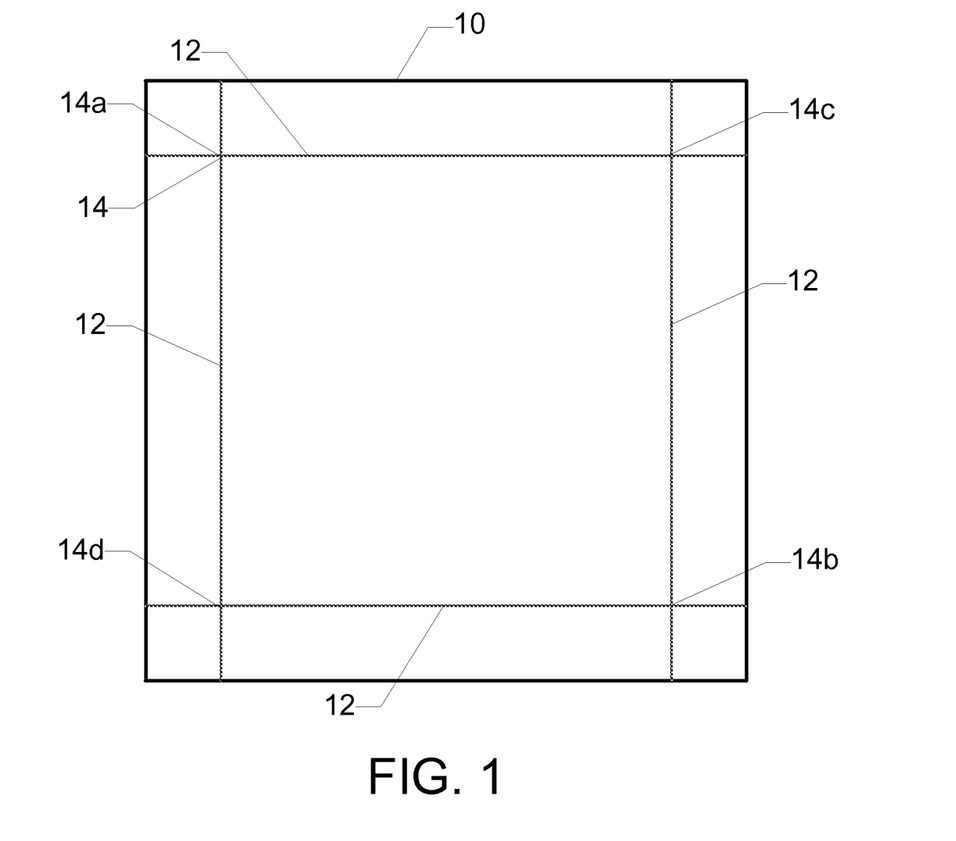
FIG. 1 is a schematic illustration of a procedure for measuring the compaction of a glass article.

As used herein, the term "compaction" refers to the dimensional change of a glass article in response to subjecting the glass article to a specified thermal cycle. FIG. 1 is a schematic illustration of a procedure for measuring the compaction of a glass article. The compaction of the glass article is measured using the following procedure. A 4 in×4 in square sample 10 of the glass article is prepared. A fiducial line 12 is scribed about 0.5 in from and substantially parallel to each edge of the sample such that four registry marks 14 are formed at intersections of the fiducial lines near the corners of the sample. The coordinates (e.g., x and y coordinates) of each of the four registry marks is determined using a Mitutoyo Apex Vision System. Using the coordinates of the four registry marks, a first diagonal distance between two opposing registry marks 14a and 14b is determined and a second diagonal distance between the other two opposing registry marks 14c and 14d is determined. An initial total diagonal distance is determined as the sum of the first diagonal distance and the second diagonal distance. The sample is subjected to a thermal cycle in which the sample is heated to about 450° C. in about four minutes, maintained at about 450° C. for about one hour, and then cooled to room temperature (e.g., about 25° C.) in about two minutes. The coordinates of the registry marks are determined again after the sample is subjected to the thermal cycle, and a final total diagonal distance is determined using the coordinates. The compaction CM is defined according to the following equation:

$$CM = \frac{D_2 - D_1}{D_1}$$

where $D_1$ is the initial total diagonal distance determined at room temperature before subjecting the sample to the thermal cycle, and $D_2$ is the final total diagonal distance determined at room temperature after subjecting the sample to the thermal cycle. Unless otherwise indicated, the compaction values described herein are the magnitude of the calculated compaction CM. In other words, unless otherwise indicated, the compaction values described herein are the absolute value of the calculated compaction CM, or |CM|.

Figure 2:
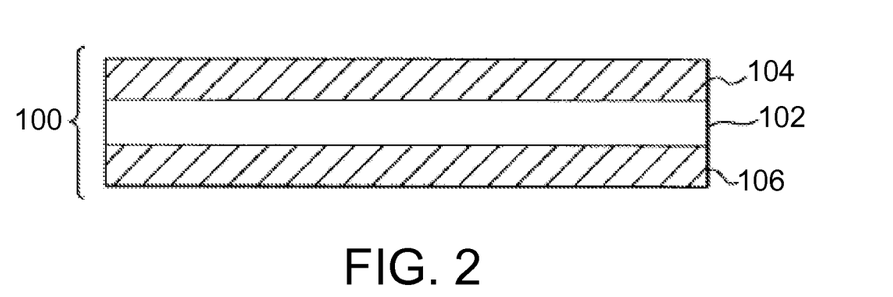
FIG. 2 is a partial cross-sectional view of one exemplary embodiment of a glass article having a laminate structure.

FIG. 2 is a cross-sectional view of one exemplary embodiment of a glass article 100. In some embodiments, glass article 100 comprises a laminated sheet comprising a plurality of glass layers. The laminated sheet can be substantially planar as shown in FIG. 2 or non-planar. Glass article 100 comprises a core layer 102 disposed between a first cladding layer 104 and a second cladding layer 106. In some embodiments, first cladding layer 104 and second cladding layer 106 are exterior layers as shown in FIG. 2. In other embodiments, the first cladding layer and/or the second cladding layer are intermediate layers disposed between the core layer and an exterior layer.

Core layer 102 comprises a first major surface and a second major surface opposite the first major surface. In some embodiments, first cladding layer 104 is fused to the first major surface of core layer 102. Additionally, or alternatively, second cladding layer 106 is fused to the second major surface of core layer 102. In such embodiments, the interfaces between first cladding layer 104 and core layer 102 and/or between second cladding layer 106 and core layer 102 are free of any bonding material such as, for example, an adhesive, a coating layer, or any non-glass material added or configured to adhere the respective cladding layers to the core layer. Thus, first cladding layer 104 and/or second cladding layer 106 are fused directly to core layer 102 or are directly adjacent to core layer 102. In some embodiments, the glass article comprises one or more intermediate layers disposed between the core layer and the first cladding layer and/or between the core layer and the second cladding layer. For example, the intermediate layers comprise intermediate glass layers and/or diffusion layers formed at the interface of the core layer and the cladding layer. The diffusion layer can comprise a blended region comprising components of each layer adjacent to the diffusion layer. In some embodiments, glass article 100 comprises a glass-glass laminate (e.g., an in situ fused multilayer glass-glass laminate) in which the interfaces between directly adjacent glass layers are glass-glass interfaces.

In some embodiments, core layer 102 comprises a first glass composition, and first and/or second cladding layers 104 and 106 comprise a second glass composition that is different than the first glass composition. For example, in the embodiment shown in FIG. 2, core layer 102 comprises the first glass composition, and each of first cladding layer 104 and second cladding layer 106 comprises the second glass composition. In other embodiments, the first cladding layer comprises the second glass composition, and the second cladding layer comprises a third glass composition that is different than the first glass composition and/or the second glass composition.

Figure 3:
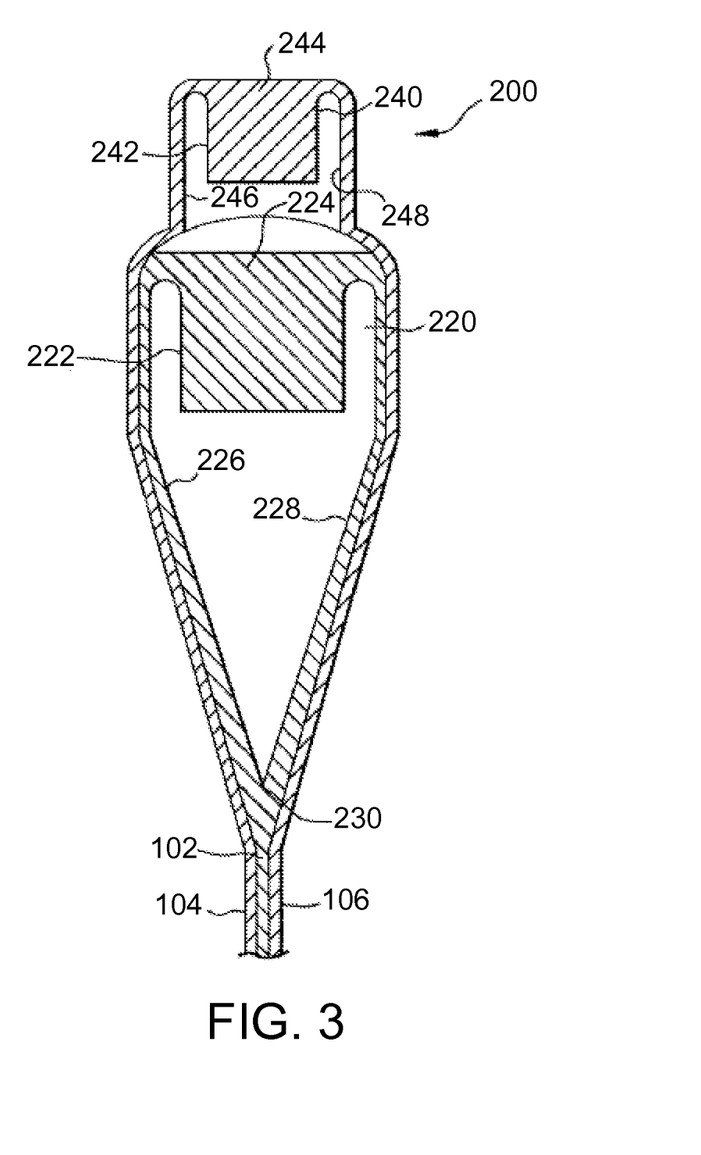
FIG. 3 is a cross-sectional view of one exemplary embodiment of a forming apparatus for forming a glass article having a laminate structure.

The glass article can be formed using a suitable process such as, for example, a fusion draw, down draw, slot draw, up draw, or float process. In some embodiments, the glass article is formed using a fusion draw process. FIG. 3 is a cross-sectional view of one exemplary embodiment of an overflow distributor 200 that can be used to form a glass article such as, for example, glass article 100. Overflow distributor 200 can be configured as described in U.S. Pat. No. 4,214,886, which is incorporated herein by reference in its entirety. For example, overflow distributor 200 comprises a lower overflow distributor 220 and an upper overflow distributor 240 positioned above the lower overflow distributor. Lower overflow distributor 220 comprises a trough 222. A first glass composition 224 is melted and fed into trough 222 in a viscous state. First glass composition 224 forms core layer 102 of glass article 100 as further described below. Upper overflow distributor 240 comprises a trough 242. A second glass composition 244 is melted and fed into trough 242 in a viscous state. Second glass composition 244 forms first and second cladding layers 104 and 106 of glass article 100 as further described below.

First glass composition 224 overflows trough 222 and flows down opposing outer forming surfaces 226 and 228 of lower overflow distributor 220. Outer forming surfaces 226 and 228 converge at a draw line 230. The separate streams of first glass composition 224 flowing down respective outer forming surfaces 226 and 228 of lower overflow distributor 220 converge at draw line 230 where they are fused together to form core layer 102 of glass article 100.

Second glass composition 244 overflows trough 242 and flows down opposing outer forming surfaces 246 and 248 of upper overflow distributor 240. Second glass composition 244 is deflected outward by upper overflow distributor 240 such that the second glass composition flows around lower overflow distributor 220 and contacts first glass composition 224 flowing over outer forming surfaces 226 and 228 of the lower overflow distributor. The separate streams of second glass composition 244 are fused to the respective separate streams of first glass composition 224 flowing down respective outer forming surfaces 226 and 228 of lower overflow distributor 220. Upon convergence of the streams of first glass composition 224 at draw line 230, second glass composition 244 forms first and second cladding layers 104 and 106 of glass article 100.

In some embodiments, first glass composition 224 of core layer 102 in the viscous state is contacted with second glass composition 244 of first and second cladding layers 104 and 106 in the viscous state to form the laminated sheet. In some of such embodiments, the laminated sheet is part of a glass ribbon traveling away from draw line 230 of lower overflow distributor 220 as shown in FIG. 3. The glass ribbon can be drawn away from lower overflow distributor 220 by a suitable means including, for example, gravity and/or pulling rollers. The glass ribbon cools as it travels away from lower overflow distributor 220. The glass ribbon is severed to separate the laminated sheet therefrom. Thus, the laminated sheet is cut from the glass ribbon. The glass ribbon can be severed using a suitable technique such as, for example, scoring, bending, thermally shocking, and/or laser cutting. In some embodiments, glass article 100 comprises the laminated sheet as shown in FIG. 2. In other embodiments, the laminated sheet can be processed further (e.g., by cutting or molding) to form glass article 100.

Although glass article 100 shown in FIG. 2 comprises three layers, other embodiments are included in this disclosure. In other embodiments, a glass article can have a determined number of layers, such as two, four, or more layers. For example, a glass article comprising two layers can be formed using two overflow distributors positioned so that the two layers are joined while traveling away from the respective draw lines of the overflow distributors or using a single overflow distributor with a divided trough so that two glass compositions flow over opposing outer forming surfaces of the overflow distributor and converge at the draw line of the overflow distributor. A glass article comprising four or more layers can be formed using additional overflow distributors and/or using overflow distributors with divided troughs. Thus, a glass article having a determined number of layers can be formed by modifying the overflow distributor accordingly.

In some embodiments, glass article 100 comprises a thickness of at least about 0.05 mm, at least about 0.1 mm, at least about 0.2 mm, or at least about 0.3 mm. Additionally, or alternatively, glass article 100 comprises a thickness of at most about 2 mm, at most about 1.5 mm, at most about 1 mm, at most about 0.7 mm, or at most about 0.5 mm. In some embodiments, a ratio of a thickness of core layer 102 to a thickness of glass article 100 is at least about 0.8, at least about 0.85, at least about 0.9, or at least about 0.95. In some embodiments, a thickness of the second layer (e.g., each of first cladding layer 104 and second cladding layer 106) is at least about 0.01 mm, at least about 0.03 mm, at least about 0.05 mm, or at least about 0.07 mm. Additionally, or alternatively, the thickness of the second layer is at most about 0.3 mm, at most about 0.2 mm, at most about 0.1 mm, at most about 0.09 mm, at most about 0.08 mm, at most about 0.07 mm, at most about 0.06 mm, or at most about 0.05 mm. For example, the thickness of the second layer is from about 0.01 mm to about 0.3 mm.

In some embodiments, the first glass composition and/or the second glass composition comprise a liquidus viscosity suitable for forming glass article 100 using a fusion draw process as described herein. For example, the first glass composition of the first layer (e.g., core layer 102) comprises a liquidus viscosity of at least about 100 kiloPoise (kP), at least about 200 kP, or at least about 300 kP. Additionally, or alternatively, the first glass composition comprises a liquidus viscosity of at most about 3000 kP, at most about 2500 kP, at most about 1000 kP, or at most about 800 kP. Additionally, or alternatively, the second glass composition of the second layer (e.g., first and/or second cladding layers 104 and 106) comprises a liquidus viscosity of at least about 50 kP, at least about 100 kP, or at least about 200 kP. Additionally, or alternatively, the second glass composition comprises a liquidus viscosity of at most about 3000 kP, at most about 2500 kP, at most about 1000 kP, or at most about 800 kP. The first glass composition can aid in carrying the second glass composition over the overflow distributor to form the second layer. Thus, the second glass composition can comprise a liquidus viscosity that is lower than generally considered suitable for forming a single layer sheet using a fusion draw process.

As used herein, the term "strain point" refers to the temperature at which a glass composition comprises a viscosity of $10^{14.68}$ Poise (P). The first glass composition and the second glass composition can have substantially equal or different strain points. In some embodiments, the first glass composition and/or the second glass composition comprises a strain point of less than 700° C., at most about 690° C., at most about 680° C., at most about 670° C., at most about 660° C., at most about 650° C., at most about 640° C., at most about 635° C., at most about 630° C., at most about 625° C., or at most about 620° C. Additionally, or alternatively, the first glass composition and/or the second glass composition comprises a strain point of at least about 450° C., at least about 480° C., at least about 500° C., at least about 550° C., or at least about 600° C. A laminated glass article can comprise a low compaction (e.g., as a result of subjecting the laminated glass article to a heat treatment as described herein) despite the relatively low strain point of the first glass composition and/or the second glass composition.

In some embodiments, glass article 100 is configured as a strengthened glass article. For example, in some embodiments, the second glass composition of the second layer (e.g., first and/or second cladding layers 104 and 106) comprises a different average coefficient of thermal expansion (CTE) than the first glass composition of the first layer (e.g., core layer 102). For example, first and second cladding layers 104 and 106 are formed from a glass composition having a lower average CTE than core layer 102. The CTE mismatch (i.e., the difference between the average CTE of first and second cladding layers 104 and 106 and the average CTE of core layer 102) results in formation of compressive stress in the cladding layers and tensile stress in the core layer upon cooling of glass article 100. In various embodiments, each of the first and second cladding layers, independently, can have a higher average CTE, a lower average CTE, or substantially the same average CTE as the core layer.

In some embodiments, the average CTE of the first layer (e.g., core layer 102) and the average CTE of the second layer (e.g., first and/or second cladding layers 104 and 106) differ by at least about $1 \times 10^{-7}$° C.$^{-1}$, at least about $2 \times 10^{-7}$° C.$^{-1}$, at least about $3 \times 10^{-7}$° C.$^{-1}$, at least about $4 \times 10^{-7}$° C.$^{-1}$, at least about $5 \times 10^{-7}$° C.$^{-1}$, at least about $10 \times 10^{-7}$° C.$^{-1}$, at least about $15 \times 10^{-7}$° C.$^{-1}$, at least about $20 \times 10^{-7}$° C.$^{-1}$, at least about $25 \times 10^{-7}$° C.$^{-1}$, or at least about $30 \times 10^{-7}$° C.$^{-1}$. Additionally, or alternatively, the average CTE of the first layer and the average CTE of the second layer differ by at most about $100 \times 10^{-7}$° C.$^{-1}$, at most about $75 \times 10^{-7}$° C.$^{-1}$, at most about $50 \times 10^{-7}$° C.$^{-1}$, at most about $40 \times 10^{-7}$° C.$^{-1}$, at most about $30 \times 10^{-7}$° C.$^{-1}$, at most about $20 \times 10^{-7}$° C.$^{-1}$, or at most about $10 \times 10^{-7}$° C.$^{-1}$. For example, in some embodiments, the average CTE of the first layer and the average CTE of the second layer differ by from about $5 \times 10^{-7}$° C.$^{-1}$ to about $30 \times 10^{-7}$° C.$^{-1}$ or from about $5 \times 10^{-7}$° C.$^{-1}$ to about $20 \times 10^{-7}$° C.$^{-1}$. In some embodiments, the second glass composition of the second layer comprises an average CTE of at most about $40 \times 10^{-7}$° C.$^{-1}$, or at most about $35 \times 10^{-7}$° C.$^{-1}$. Additionally, or alternatively, the second glass composition of the second layer comprises an average CTE of at least about $25 \times 10^{-7}$° C.$^{-1}$, or at least about $30 \times 10^{-7}$° C.$^{-1}$. Additionally, or alternatively, the first glass composition of the first layer comprises an average CTE of at least about $35 \times 10^{-7}$° C.$^{-1}$, at least about $40 \times 10^{-7}$° C.$^{-1}$, at least about $50 \times 10^{-7}$° C.$^{-1}$, or at least about $55 \times 10^{-7}$° C.$^{-1}$. Additionally, or alternatively, the first glass composition of the first layer comprises an average CTE of at most about $80 \times 10^{-7}$° C.$^{-1}$, at most about $70 \times 10^{-7}$° C.$^{-1}$, or at most about $60 \times 10^{-7}$° C.$^{-1}$.

In some embodiments, the compressive stress of the cladding layers is at most about 800 MPa, at most about 500 MPa, at most about 300 MPa, at most about 200 MPa, at most about 150 MPa, at most about 100 MPa, at most about 50 MPa, or at most about 40 MPa. Additionally, or alternatively, the compressive stress of the cladding layers is at least about 10 MPa, at least about 20 MPa, at least about 30 MPa, at least about 50 MPa, or at least about 100 MPa.

In some embodiments, the glass article described herein is a strengthened glass article having the quality surface and other attributes generally associated with the fusion draw forming process. Such a glass article can be used to form strengthened display devices. However, it has been found that laminated glass articles generally have a substantially higher compaction than single-layer glass articles. Such higher compaction results in increased shrinkage of the glass article as the glass article is heated. Such shrinkage can cause problems during formation of electronics on the glass article (e.g., during a polysilicon manufacturing process). Thus, it may be beneficial to reduce the compaction of a laminated glass article to a level that is similar to or lower than conventional glass substrates used in display applications.

In some embodiments, glass article 100 comprises a compaction of at most about 20 ppm, at most about 15 ppm, at most about 10 ppm, at most about 5 ppm, at most about 3 ppm, at most about 2 ppm, or at most about 1 ppm. Such relatively low compaction can enable the glass article to be suitable for use in display applications. For example, such relatively low compaction can enable use of the glass article in relatively high resolution displays (e.g., displays with a resolution of at least about 300 ppi).

In some embodiments, glass article 100 is subjected to a heat treatment (e.g., to reduce the compaction of the glass article). For example, glass article 100 is formed using the fusion draw process as described herein. In some embodiments, glass article 100 is heated to a reheat temperature. In some embodiments, the reheat temperature is at least about 400° C., at least about 450° C., or at least about 475° C. Additionally, or alternatively, the reheat temperature is at most about 600° C., at most about 550° C., or at most about 525° C. In some embodiments, glass article 100 is heated to the reheat temperature over a reheating period. For example, the reheating period is from about 2 min to about 6 min. In other embodiments, glass article 100 is at the reheat temperature prior to subjecting the glass article to the heat treatment. For example, glass article 100 is subjected to the heat treatment during forming (e.g., as the glass ribbon travels away from the overflow distributor during the fusion draw process). Glass article 100 is maintained within a hold temperature range for a holding period. In some embodiments, the hold temperature range is from about 400° C. to about 600° C., from about 450° C. to about 550° C., or from about 475° C. to about 525° C. Additionally, or alternatively, the holding period is at least about 30 min, at least about 45 min, or at least about 55 min. Additionally, or alternatively, the holding period is at most about 5 h, at most about 2 h, at most about 90 min, at most about 75 min, or at most about 65 min. For example, the holding period is from about 30 min to about 90 min, from about 45 min to about 75 min, or from about 55 min to about 65 min. Subsequent to maintaining glass article 100 at the hold temperature for the holding period, the glass article is cooled to a quench temperature over a quenching period. In some embodiments, the quench temperature is at most about 50° C., at most about 40° C., or at most about 30° C. Additionally, or alternatively, the quenching period is at least about 30 s, at least about 45 s, or at least about 55 s. Additionally, or alternatively, the quenching period is at most about 60 min, at most about 45 min, at most about 30 min, at most about 15 min, at most about 10 min, at most about 5 min, at most about 2 min, at most about 90 s, at most about 75 s, or at most about 65 s. For example, the quenching period is from about 30 s to about 90 s, from about 45 s to about 75 s, or from about 55 s to about 65 s. In some embodiments, subsequent to maintaining glass article 100 at the hold temperature for the holding period and prior to cooling the glass article to the quench temperature over the quenching period, the glass article is cooled to a cool temperature at a cooling rate. In some embodiments, the cool temperature is about 200° C. Additionally, or alternatively, the cooling rate is at least about 1° C./min, at least about 2° C./min, or at least about 3° C./min. Additionally, or alternatively, the cooling rate is at most about 10° C./min, at most about 9° C./min, at most about 8° C./min, at most about 7° C./min, at most about 6° C./min, or at most about 5.5° C./min. For example, the cooling rate is from about 3° C./min to about 7° C./min, from about 4° C./min to about 6° C./min, or from about 4.5° C./min to about 5.5° C./min.

In some embodiments, a p-Si electronic device is formed on a surface of glass article 100. For example, the p-Si electronic device is a p-Si based electronic device or an electronic device that comprises p-Si. Subjecting the glass article to the heat treatment can enable formation of the p-Si electronic device without the potential problems that can arise upon heating a glass substrate to the relatively high temperatures associated with the p-Si based electronics manufacturing process. For example, the heat treatment can reduce the compaction of the glass article, thus reducing the dimensional change of the glass article during forming of the p-Si electronic device.

The first glass composition of the first layer (e.g., core layer 102) and the second glass composition of the second layer (e.g., first cladding layer 104 and/or second cladding layer 106) can comprise suitable glass compositions capable of forming a glass article with desired properties as described herein. Exemplary first (core) glass compositions and exemplary second (clad) glass compositions are shown in Tables 1 and 2, respectively. The amounts of the various components are given in Tables 1 and 2 as mol % on an oxide basis.

In some embodiments, the first glass composition comprises a glass network former selected from the group consisting of $SiO_2$, $Al_2O_3$, $B_2O_3$, and combinations thereof. For example, the first glass composition comprises at least about 50 mol % $SiO_2$, at least about 55 mol % $SiO_2$, at least about 60 mol % $SiO_2$, at least about 65 mol % $SiO_2$, or at least about 70 mol % $SiO_2$. Additionally, or alternatively, the first glass composition comprises at most about 80 mol % $SiO_2$, at most about 73 mol % $SiO_2$, at most about 70 mol % $SiO_2$, at most about 68 mol % $SiO_2$, or at most about 60 mol % $SiO_2$. Additionally, or alternatively, the first glass composition comprises at least about 5 mol % $Al_2O_3$, at least about 9 mol % $Al_2O_3$, or at least about 12 mol % $Al_2O_3$. Additionally, or alternatively, the first glass composition comprises at most about 20 mol % $Al_2O_3$, at most about 17 mol % $Al_2O_3$, or at most about 11 mol % $Al_2O_3$. Additionally, or alternatively, the first glass composition comprises at least about 0.5 mol % $B_2O_3$, at least about 3 mol % $B_2O_3$, at least about 6 mol % $B_2O_3$, or at least about 7 mol % $B_2O_3$. Additionally, or alternatively, the first glass composition comprises at most about 11 mol % $B_2O_3$, at most about 8 mol % $B_2O_3$, at most about 4 mol % $B_2O_3$, or at most about 1 mol % $B_2O_3$.

In some embodiments, the first glass composition comprises an alkali metal oxide selected from the group consisting of $Li_2O$, $Na_2O$, $K_2O$, and combinations thereof. For example, the first glass composition comprises at least about 0.05 mol % $Na_2O$, at least about 0.1 mol % $Na_2O$, at least about 10 mol % $Na_2O$, or at least about 13 mol % $Na_2O$. Additionally, or alternatively, the first glass composition comprises at most about 16 mol % $Na_2O$, at most about 14 mol % $Na_2O$, at most about 2 mol % $Na_2O$, at most about 0.2 mol % $Na_2O$, or at most about 0.1 mol % $Na_2O$. Additionally, or alternatively, the first glass composition comprises at least about 0.01 mol % $K_2O$, at least about 2 mol % $K_2O$, or at least about 8 mol % $K_2O$. Additionally, or alternatively, the first glass composition comprises at most about 15 mol % $K_2O$, at most about 9 mol % $K_2O$, at most about 6 mol % $K_2O$, at most about 0.5 mol % $K_2O$, or at most about 0.1 mol % $K_2O$.

In some embodiments, the first glass composition comprises an alkaline earth oxide selected from the group consisting of MgO, CaO, SrO, BaO, and combinations thereof. For example, the first glass composition comprises at least about 0.01 mol % MgO, at least about 1 mol % MgO, at least about 2 mol % MgO, at least about 3 mol % MgO, or at least about 4 mol % MgO. Additionally, or alternatively, the first glass composition comprises at most about 8 mol % MgO, at most about 4 mol % MgO, at most about 3 mol % MgO, at most about 1 mol % MgO, or at most about 0.05 mol % MgO. Additionally, or alternatively, the first glass composition comprises at least about 0.01 mol % CaO, at least about 0.1 mol % CaO, at least about 1 mol % CaO, at least about 2 mol % CaO, at least about 4 mol % CaO, at least about 5 mol % CaO, or at least about 6 mol % CaO. Additionally, or alternatively, the first glass composition comprises at most about 9 mol % CaO, at most about 8 mol % CaO, at most about 7 mol % CaO, at most about 2 mol % CaO, at most about 0.2 mol % CaO, or at most about 0.1 mol % CaO. Additionally, or alternatively, the first glass composition comprises at least about 3 mol % SrO, at least about 4 mol % SrO, at least about 5 mol % SrO, at least about 6 mol % SrO, or at least about 9 mol % SrO. Additionally, or alternatively, the first glass composition comprises at most about 10 mol % SrO, at most about 7 mol % SrO, at most about 6 mol % SrO, or at most about 5 mol % SrO. Additionally, or alternatively, the first glass composition comprises at least about 0.01 mol % BaO, at least about 0.02 mol % BaO, at least about 0.07 mol % BaO, at least about 1 mol % BaO, at least about 5 mol % BaO, or at least about 9 mol % BaO. Additionally, or alternatively, the first glass composition comprises at most about 10 mol % BaO, at most about 7 mol % BaO, at most about 1 mol % BaO, at most about 0.7 mol % BaO, at most about 0.6 mol % BaO, at most about 0.5 mol % BaO, at most about 0.4 mol % BaO, at most about 0.3 mol % BaO, at most about 0.2 mol % BaO, at most about 0.1 mol % BaO, at most about 0.09 mol % BaO, or at most about 0.05 mol % BaO. In some embodiments, the first glass composition is substantially free or free of BaO. For example, the first glass composition comprises at most about 0.1 mol % BaO or at most about 0.01 mol % BaO.

In some embodiments, the first glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$. In some embodiments, the first glass composition is substantially free or free of $As_2O_3$. For example, the first glass composition comprises at most about 0.1 mol % $As_2O_3$ or at most about 0.01 mol % $As_2O_3$.

In some embodiments, the second glass composition comprises a glass network former selected from the group consisting of $SiO_2$, $Al_2O_3$, $B_2O_3$, and combinations thereof. For example, the second glass composition comprises at least about 60 mol % $SiO_2$, at least about 62 mol % $SiO_2$, or at least about 67 mol % $SiO_2$. Additionally, or alternatively, the second glass composition comprises at most about 70 mol % $SiO_2$, at most about 68 mol % $SiO_2$, at most about 65 mol % $SiO_2$, or at most about 63 mol % $SiO_2$. Additionally, or alternatively, the second glass composition comprises at least about 6 mol % $Al_2O_3$, at least about 10 mol % $Al_2O_3$, or at least about 12 mol % $Al_2O_3$. Additionally, or alternatively, the second glass composition comprises at most about 18 mol % $Al_2O_3$, at most about 13 mol % $Al_2O_3$, or at most about 8 mol % $Al_2O_3$. Additionally, or alternatively, the second glass composition comprises at least about 4 mol % $B_2O_3$, at least about 6 mol % $B_2O_3$, at least about 7 mol % $B_2O_3$, at least about 9 mol % $B_2O_3$, at least about 14 mol % $B_2O_3$, at least about 16 mol % $B_2O_3$, or at least about 18 mol % $B_2O_3$. Additionally, or alternatively, the second glass composition comprises at most about 21 mol % $B_2O_3$, at most about 18 mol % $B_2O_3$, or at most about 11 mol % $B_2O_3$.

In some embodiments, the second glass composition comprises an alkali metal oxide selected from the group consisting of $Li_2O$, $Na_2O$, $K_2O$, and combinations thereof. For example, the second glass composition comprises from about 0 mol % to about 0.1 mol % $Na_2O$, or from about 0 mol % to about 0.06 mol % $Na_2O$. Additionally, or alternatively, the second glass composition comprises from about 0 mol % to about 0.05 mol % $K_2O$, or from about 0 mol % to about 0.03 mol % $K_2O$. In some embodiments, the second glass composition is substantially free of alkali metal or substantially alkali free. For example, the second glass composition comprises at most about 0.1 mol % alkali metal oxide. In other embodiments, the second glass composition comprises from about 5 mol % to about 10 mol % alkali metal oxide.

In some embodiments, the second glass composition comprises an alkaline earth oxide selected from the group consisting of MgO, CaO, SrO, BaO, and combinations thereof. For example, the second glass composition comprises at least about 0.2 mol % MgO, at least about 1 mol % MgO, or at least about 3 mol % MgO. Additionally, or alternatively, the second glass composition comprises at most about 5 mol % MgO, at most about 4 mol % MgO, at most about 2 mol % MgO, or at most about 0.5 mol % MgO. Additionally, or alternatively, the second glass composition comprises at least about 3 mol % CaO, at least about 4 mol % CaO, at least about 5 mol % CaO, or at least about 8 mol % CaO. Additionally, or alternatively, the second glass composition comprises at most about 12 mol % CaO, at most about 9 mol % CaO, at most about 8 mol % CaO, or at most about 5 mol % CaO. Additionally, or alternatively, the second glass composition comprises at least about 0.2 mol % SrO, at least about 1 mol % SrO, or at least about 2 mol % SrO. Additionally, or alternatively, the second glass composition comprises at most about 3 mol % SrO, at most about 2 mol % SrO, or at most about 1 mol % SrO. Additionally, or alternatively, the second glass composition comprises at least about 0.01 mol % BaO, at least about 0.02 mol % BaO, or at least about 1 mol % BaO. Additionally, or alternatively, the second glass composition comprises at most about 2 mol % BaO, at most about 1 mol % BaO, at most about 0.7 mol % BaO, at most about 0.6 mol % BaO, at most about 0.5 mol % BaO, at most about 0.4 mol % BaO, at most about 0.3 mol % BaO, at most about 0.2 mol % BaO, at most about 0.1 mol % BaO, at most about 0.03 mol % BaO, at most about 0.02 mol % BaO, or at most about 0.01 mol % BaO. In some embodiments, the second glass composition is substantially free or free of BaO. For example, the second glass composition comprises at most about 0.1 mol % BaO or at most about 0.01 mol % BaO. In some embodiments, the second glass composition comprises from about 3 mol % to about 16 mol % alkaline earth oxide.

In some embodiments, the second glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$. In some embodiments, the second glass composition is substantially free or free of $As_2O_3$. For example, the second glass composition comprises at most about 0.1 mol % $As_2O_3$ or at most about 0.01 mol % $As_2O_3$.

TABLE 1

Exemplary First (Core) Glass Compositions

|  | 1-1 | 1-2 | 1-3 | 1-4 | 1-5 | 1-6 | 1-7 |
|---|---|---|---|---|---|---|---|
| $SiO_2$ | 61.97 | 66.54 | 63.46 | 69.05 | 56.12 | 59.05 | 56.24 |
| $Al_2O_3$ | 10.89 | 10.03 | 9.56 | 10.2 | 16.73 | 15.1 | 14.38 |
| $B_2O_3$ | 10.09 | 6 | 7.09 |  | 10.5 | 6.26 | 7.16 |
| $Na_2O$ | 0.07 | 0.09 | 0.09 | 15.13 | 0.064 | 0.086 | 0.084 |
| $K_2O$ | 2.17 | 5.79 | 5.79 |  | 3.084 | 8.059 | 8.042 |
| MgO | 6.16 | 1.9 | 2.49 | 5.49 | 3.74 | 1.13 | 1.48 |
| CaO | 5.45 | 6.23 | 7.41 |  | 4.61 | 5.16 | 6.13 |
| SrO | 3.09 | 3.28 | 3.95 |  | 4.83 | 5.02 | 6.04 |
| BaO | 0.03 | 0.04 | 0.04 |  | 0.08 | 0.08 | 0.1 |
| $SnO_2$ | 0.04 | 0.07 | 0.07 | 0.13 | 0.092 | 0.151 | 0.164 |
| $ZrO_2$ | 0.01 | 0.02 | 0.03 |  | 0.023 | 0.032 | 0.051 |
| $Fe_2O_3$ | 0.01 | 0.01 | 0.01 |  | 0.033 | 0.031 | 0.032 |
| $As_2O_3$ |  |  |  |  | 0.0002 | 0.0002 | 0.0002 |

|  | 1-8 | 1-9 | 1-10 | 1-11 | 1-12 | 1-13 | 1-14 | 1-15 | 1-16 |
|---|---|---|---|---|---|---|---|---|---|
| $SiO_2$ | 67.45 | 69.17 | 68.84 | 72.01 | 71.26 | 71.03 | 62.4 | 63.76 | 66.72 |
| $Al_2O_3$ | 12.69 | 8.53 | 10.63 | 7.8 | 7.84 | 7.85 | 10.89 | 9.55 | 10.03 |
| $B_2O_3$ | 3.67 |  |  |  | 0.84 |  | 9.78 | 7 | 6 |
| $Na_2O$ | 13.67 | 13.94 | 14.86 | 0.15 | 0.16 | 0.17 |  |  |  |
| $K_2O$ | 0.02 | 1.17 | 0.02 | 0.01 | 0.01 | 0.01 | 2.24 | 5.78 | 5.78 |
| MgO | 2.36 | 6.45 | 5.43 | 0.03 | 0.03 | 0.03 | 6.23 | 2.49 | 1.9 |
| CaO | 0.03 | 0.54 | 0.04 | 0.18 | 0.37 | 1.37 | 5.37 | 7.4 | 6.23 |
| SrO |  |  |  | 9.74 | 9.43 | 9.47 | 3.03 | 3.95 | 3.28 |
| BaO |  |  |  | 9.90 | 9.88 | 9.89 |  |  |  |
| $SnO_2$ | 0.09 | 0.19 | 0.17 | 0.09 | 0.09 | 0.09 | 0.07 | 0.07 | 0.07 |
| $ZrO_2$ | 0.01 |  |  |  |  |  |  |  |  |
| $Fe_2O_3$ | 0.01 |  |  | 0.01 | 0.01 | 0.01 |  |  |  |
| $As_2O_3$ |  |  |  |  |  |  |  |  |  |
| $TiO_2$ |  |  |  | 0.07 | 0.07 | 0.07 |  |  |  |

TABLE 2

Exemplary Second (Clad) Glass Compositions

|  | 2-1 | 2-2 | 2-3 | 2-4 | 2-5 | 2-6 | 2-7 |
|---|---|---|---|---|---|---|---|
| $SiO_2$ | 69.44 | 67.55 | 62.93 | 64.59 | 60.48 | 62.39 | 67.29 |
| $Al_2O_3$ | 12.36 | 11 | 10.74 | 7.38 | 11.55 | 17.21 | 6.47 |
| $B_2O_3$ | 4.35 | 9.83 | 13.16 | 16.45 | 17.6 | 10.5 | 20.99 |
| $Na_2O$ |  |  |  |  | 0.05 |  |  |
| $K_2O$ |  |  |  |  | 0.022 |  |  |
| MgO | 4.01 | 2.26 | 3.58 | 2.21 | 1.38 | 1.41 | 0.35 |
| CaO | 5.98 | 8.73 | 7.32 | 8.14 | 7.01 | 7.51 | 4.49 |
| SrO | 1.73 | 0.52 | 2.17 | 1.11 | 1.86 | 0.83 | 0.29 |
| BaO | 1.98 |  | 0.01 | 0.01 | 0.02 |  | 0.01 |
| $SnO_2$ | 0.1 | 0.07 | 0.07 | 0.06 | 0.208 | 0.16 | 0.05 |

TABLE 2-continued

| Exemplary Second (Clad) Glass Compositions | | | | | |
|---|---|---|---|---|---|
| $ZrO_2$ | 0.03 | 0.02 | | 0.14 | 0.05 |
| $Fe_2O_3$ | 0.02 | 0.01 | 0.01 | 0.01 | 0.039 | 0.01 |
| $As_2O_3$ | | | | | 0.0004 | |

| | 2-8 | 2-9 |
|---|---|---|
| $SiO_2$ | 64.64 | 67.6 |
| $Al_2O_3$ | 7.38 | 10.99 |
| $B_2O_3$ | 16.45 | 9.82 |
| $Na_2O$ | | |
| $K_2O$ | | |
| MgO | 2.21 | 2.26 |
| CaO | 8.14 | 8.72 |
| SrO | 1.11 | 0.52 |
| BaO | | |
| $SnO_2$ | 0.07 | 0.08 |
| $ZrO_2$ | | |
| $Fe_2O_3$ | | |
| $As_2O_3$ | | |

The glass articles described herein can be used for a variety of applications including, for example, for cover glass or glass backplane applications in consumer or commercial electronic devices including, for example, LCD, LED, OLED, and quantum dot displays, computer monitors, and automated teller machines (ATMs); for touch screen or touch sensor applications, for portable electronic devices including, for example, mobile telephones, personal media players, and tablet computers; for integrated circuit applications including, for example, semiconductor wafers; for photovoltaic applications; for architectural glass applications; for automotive or vehicular glass applications; for commercial or household appliance applications; for lighting or signage (e.g., static or dynamic signage) applications; or for transportation applications including, for example, rail and aerospace applications.

In some embodiments, a display device comprises a glass article as described herein. For example, the display device comprises a high-definition display device. The high-definition display device is capable of presenting native video at a minimum resolution of 1280×720p, 1920×1080i, or 1920×1080p. Additionally, or alternatively, the display device comprises an ultra-high-definition display device. The ultra-high-definition display device comprises an aspect ratio of at least 16:9 and at least one digital input capable of carrying and presenting native video at a minimum resolution of 3840×2160. In some embodiments, the display device comprises a transparent display device. The transparent display device allows transmission of some amount of visible light through the display while simultaneously displaying an image. In some embodiments, the glass article comprises a cover glass.

EXAMPLES

Various embodiments will be further clarified by the following examples.

Comparative Example 1

A single-layer glass sheet is formed using a fusion draw process. The single-layer glass sheet is formed from exemplary glass composition 2-9, which has a strain point of 660° C. and a CTE of 31.7×10$^{-7}$° C.$^{-1}$. The glass sheet has a compaction of about 18 ppm to about 20 ppm.

Example 1

A laminated glass sheet having the laminate structure shown in FIG. 2 was formed using a fusion draw process. The core layer was formed from exemplary glass composition 1-16, which had a strain point of 614° C. and a CTE of about 59.8×10$^{-7}$° C.$^{-1}$. Each of the first cladding layer and the second cladding layer was formed from exemplary glass composition 2-9, which had a strain point of about 660° C. and a CTE of about 31.7×10$^{-7}$° C.$^{-1}$. The laminated glass sheet had a thickness of about 0.7 mm. A ratio of the thickness of the core layer to the total thickness of the cladding layers was about 9. As formed, the laminated glass sheet had a compaction of about 50 ppm.

The laminated glass sheet was subjected to a heat treatment that included (in order) heating the laminated glass sheet to about 500° C. over about 4 min, holding the laminated glass sheet at about 500° C. for about 56 min, cooling the laminated glass sheet to 200° C. at a rate of about 5° C./min, and cooling the laminated glass sheet to room temperature over about 2 min using a fan. The compaction of the laminated glass sheet following the heat treatment was about 0.81 ppm.

Example 2

A laminated glass sheet having the laminate structure shown in FIG. 2 was formed using a fusion draw process. The core layer was formed from exemplary glass composition 1-16. Each of the first cladding layer and the second cladding layer was formed from exemplary glass composition 2-9. The laminated glass sheet had a thickness of about 0.7 mm. A ratio of the thickness of the core layer to the total thickness of the cladding layers was about 9. As formed, the laminated glass sheet had a compaction of about 50 ppm.

The laminated glass sheet was subjected to a heat treatment that included (in order) heating the laminated glass sheet to about 500° C. over about 4 min, holding the laminated glass sheet at about 500° C. for about 56 min, and cooling the laminated glass sheet to room temperature over about 2 min using a fan. The compaction of the laminated glass sheet following the heat treatment was about 22.89 ppm.

Example 3

Four laminated glass sheets having the laminate structure shown in FIG. 2 were formed using a fusion draw process. The core layer of each laminated glass sheet was formed from exemplary glass composition 1-16. Each of the first cladding layer and the second cladding layer of each laminated glass sheet was formed from exemplary glass composition 2-9. Each laminated glass sheet had a thickness of about 0.7 mm. A ratio of the thickness of the core layer of each laminated glass sheet to the total thickness of the cladding layers of the laminated glass sheet was about 9. As formed, each of the laminated glass sheets had a compaction of about 50 ppm.

Each of the laminated glass sheets was subjected to a heat treatment that included (in order) heating the laminated glass sheet to about 675° C. over about 4 min, holding the laminated glass sheet at about 675° C. for about 56 min, and cooling the laminated glass sheet to room temperature over about 2 min using a fan. The average compaction of the laminated glass sheets following the heat treatment was about 41.77 ppm.

Even though the cladding layers of the laminated glass sheets of Examples 1, 2, and 3 are formed from the same glass composition as the single-layer glass sheet of the Comparative Example, the laminated glass sheets have a substantially higher compaction prior to the heat treatment. Without wishing to be bound by any theory, it is believed that the difference in chemical and/or physical properties (e.g., viscosity) of the adjacent glass layers leads to the layers compacting against each other in response to heating, which increases the compaction of the glass sheet.

Examples 1, 2, and 3 illustrate that subjecting a laminated glass article to a heat treatment enables the compaction of the laminated glass article to be reduced to a level that is comparable to or less than that of conventional glass substrates used in display applications. This is a surprising result given the substantially increased compaction of the glass laminate prior to heat treatment compared to the single-layer glass sheet and the effect of the interaction between adjacent glass layers.

Moreover, Examples 1, 2, and 3 illustrate the importance of the proper temperature(s) and time(s) for the heat treatment. For example, heating the laminated glass sheet to a higher temperature as in Example 3 reduced the compaction of the laminated glass sheet by a lesser amount compared to heating the laminated glass sheet to a lower temperature as in Examples 1 and 2. Additionally, including a cooling step prior to the quenching step as in Example 1 reduced the compaction by a greater amount compared to the heat treatment used in Example 2.

It will be apparent to those skilled in the art that various modifications and variations can be made without departing from the spirit or scope of the invention. Accordingly, the invention is not to be restricted except in light of the attached claims and their equivalents.

What is claimed is:

1. A strengthened glass article comprising:
   a first glass cladding layer;
   a second glass cladding layer; and
   a glass core layer disposed between the first glass cladding layer and the second glass cladding layer;
   wherein a coefficient of thermal expansion (CTE) of each of the first glass cladding layer and the second glass cladding layer is at least $1 \times 10^{7\circ}$ $C.^{-1}$ less than a CTE of the glass core layer;
   wherein each of the glass core layer and the glass cladding layer comprises a strain point of less than 650° C.;
   wherein each of the first glass cladding layer and the second glass cladding layer comprises a compressive stress of at least about 20 MPa; and
   wherein a compaction of the glass article is at most about 20 ppm.

2. The glass article of claim 1, wherein at least one of the glass cladding layers is substantially free of BaO.

3. The glass article of claim 1, wherein at least one of the glass cladding layers comprises from about 60 mol % to about 70 mol % $SiO_2$, from about 6 mol % to about 18 mol % $Al_2O_3$, from about 6 mol % to about 21 mol % $B_2O_3$, from about 0.2 mol % to about 5 mol % MgO, and from about 8 mol % to about 12 mol % CaO.

4. The glass article of claim 1, wherein the glass cladding layer is substantially free of alkali metal.

5. The glass article of claim 1, wherein the glass cladding layer is substantially free of $As_2O_3$.

6. The glass article of claim 1, wherein the glass core layer comprises from about 50 mol % to about 80 mol % $SiO_2$, from about 5 mol % to about 20 mol % $Al_2O_3$, and from about 1 mol % to about 8 mol % MgO.

7. The glass article of claim 1, wherein the compaction of the glass article is at most about 3 ppm.

8. The glass article of claim 1, wherein the compaction of the glass article is at most about 1 ppm.

9. The glass article of claim 1, further comprising a poly-crystalline silicon (p-Si) electronic device formed on a surface of the glass article.

10. The glass article of claim 9, wherein the p-Si electronic device comprises a thin-film-transistor (TFT).

11. A display device comprising the glass article of claim 1.

12. A method comprising:
   forming a glass article comprising a glass core layer and a glass cladding layer adjacent to the glass core layer;
   maintaining the glass article within a hold temperature range from about 400° C. to about 600° C. for a holding period from about 30 minutes to about 90 minutes; and
   cooling the glass article to a quench temperature of at most about 50° C. over a cooling period from about 30 seconds to about 5 minutes subsequent to the maintaining step.

13. The method of claim 12, further comprising cooling the glass article to a cool temperature of about 200° C. at a cooling rate from about 1° C./minute to about 7° C./minute subsequent to the maintaining step and prior to the cooling the glass article to the quench temperature step.

14. The method of claim 12, wherein the glass cladding layer comprises a first glass cladding layer and a second glass cladding layer, and the glass core layer is disposed between the first glass cladding layer and the second glass cladding layer.

15. The method of claim 12, further comprising forming a poly-crystalline silicon (p-Si) electronic device on a surface of the glass article.

16. The method of claim 12, wherein the forming the glass article comprises contacting the glass core layer in a viscous state with the glass cladding layer in a viscous state using an overflow distributor.

17. A method comprising:
   heating a glass article to a first temperature of at least about 400° C., the glass article comprising a glass core layer and a glass cladding layer adjacent to the glass core layer;
   maintaining the glass article within a temperature range from about 400° C. to about 600° C. for a holding period from about 30 minutes to about 90 minutes; and
   cooling the glass article to a second temperature of at most about 50° C. over a cooling period from about 30 seconds to about 5 minutes subsequent to the maintaining step.

18. The method of claim 17, further comprising cooling the glass article to an intermediate temperature of about 200° C. at a cooling rate from about 1° C./minute to about 7° C./minute subsequent to the maintaining step and prior to the cooling the glass article to the second temperature step.

19. The method of claim 17, wherein the glass cladding layer comprises a first glass cladding layer and a second glass cladding layer, and the glass core layer is disposed between the first glass cladding layer and the second glass cladding layer.

20. The method of claim 17, further comprising forming a poly-crystalline silicon (p-Si) electronic device on a surface of the glass article.

21. The method of claim 12, wherein subsequent to the cooling step, a compaction of the glass article is at most about 20 ppm.

22. The method of claim 17, wherein subsequent to the cooling step, a compaction of the glass article is at most about 20 ppm.

23. A glass article made by the method of claim 12.

* * * * *

UNITED STATES PATENT AND TRADEMARK OFFICE
CERTIFICATE OF CORRECTION

PATENT NO. : 10,562,272 B2
APPLICATION NO. : 15/534192
DATED : February 18, 2020
INVENTOR(S) : Timothy James Kiczenski et al.

It is certified that error appears in the above-identified patent and that said Letters Patent is hereby corrected as shown below:

In Column 15, Line 43, Claim 1, delete "$1\times10^7$" and insert -- $1\times10^{-7}$ --, therefor.

Signed and Sealed this
Twenty-sixth Day of May, 2020

Andrei Iancu
*Director of the United States Patent and Trademark Office*